(12) United States Patent
Okada

(10) Patent No.: US 10,008,607 B2
(45) Date of Patent: Jun. 26, 2018

(54) THIN-FILM TRANSISTOR

(71) Applicant: Japan Display Inc., Minato-ku (JP)

(72) Inventor: Takashi Okada, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/427,533

(22) Filed: Feb. 8, 2017

(65) Prior Publication Data

US 2017/0229584 A1    Aug. 10, 2017

(30) Foreign Application Priority Data

Feb. 9, 2016 (JP) .................................. 2016-022627

(51) Int. Cl.
*H01L 29/786* (2006.01)
*H01L 29/49* (2006.01)
(Continued)

(52) U.S. Cl.
CPC .... *H01L 29/78675* (2013.01); *H01L 21/0262* (2013.01); *H01L 21/02532* (2013.01); *H01L 21/02554* (2013.01); *H01L 21/02565* (2013.01); *H01L 21/02592* (2013.01); *H01L 21/02595* (2013.01); *H01L 21/02631* (2013.01);
(Continued)

(58) Field of Classification Search
CPC ......... H01L 29/78678; H01L 29/78675; H01L 29/78672; H01L 29/78669; H01L 29/78666; H01L 29/78693; H01L 29/7869; H01L 29/78663; H01L 29/7866; H01L 29/263; H01L 29/247; H01L 29/2206; H01L 29/2006; H01L 29/185;
(Continued)

(56) References Cited

U.S. PATENT DOCUMENTS 5,053,347 A * 10/1991 Wu .................... H01L 29/6675
                                                              257/57
5,294,811 A *  3/1994 Aoyama ................ H01L 27/12
                                                              257/347
(Continued)

FOREIGN PATENT DOCUMENTS

EP         0473988 A1 *  3/1992    ....... H01L 29/66757
JP         4-206532              7/1992
(Continued)

OTHER PUBLICATIONS

Yen et al., Improvement in pH Sensitivity of Low-Temperature Polycrystalline-Silicon Thin-Film Transistor Sensors Using H2 Sintering, Sensors, 14, 2014, pp. 3825-3832.*
(Continued)

*Primary Examiner* — Earl Taylor
(74) *Attorney, Agent, or Firm* — Oblon, McClelland, Maier & Neustadt, L.L.P.

(57) ABSTRACT

According to one embodiment, a thin-film transistor includes a polycrystalline semiconductor layer, a gate electrode opposing the polycrystalline semiconductor layer, a gate insulating film provided between the gate electrode and the polycrystalline semiconductor layer and in contact with the gate electrode, and an amorphous layer provided between the gate insulating film and the polycrystalline semiconductor layer, and in contact with the gate insulating film and the polycrystalline semiconductor layer.

13 Claims, 4 Drawing Sheets

(51) Int. Cl.
*H01L 29/51* (2006.01)
*H01L 21/02* (2006.01)

(52) U.S. Cl.
CPC ........ *H01L 29/4908* (2013.01); *H01L 29/517* (2013.01); *H01L 29/78678* (2013.01); *H01L 29/78693* (2013.01); *H01L 29/78696* (2013.01)

(58) Field of Classification Search
CPC ........... H01L 29/1604; H01L 21/02595; H01L 21/02592; H01L 29/6675; H01L 29/786
See application file for complete search history.

(56) References Cited

U.S. PATENT DOCUMENTS

| | | | | |
|---|---|---|---|---|
| 6,285,041 B1 * | 9/2001 | Noguchi | H01L 29/66765 | 257/350 |
| 6,410,373 B1 * | 6/2002 | Chang | H01L 29/66757 | 257/E21.413 |
| 6,624,473 B1 * | 9/2003 | Takehashi | H01L 29/42384 | 257/344 |
| 8,017,946 B2 * | 9/2011 | Yamazaki | H01L 29/04 | 257/350 |
| 8,569,760 B2 * | 10/2013 | You | H01L 29/78678 | 257/59 |
| 8,796,692 B2 * | 8/2014 | Kanegae | H01L 29/66765 | 257/72 |
| 8,860,037 B2 * | 10/2014 | Kawashima | H01L 21/02422 | 257/205 |
| 8,987,822 B2 * | 3/2015 | Kondo | H01L 27/1259 | 257/347 |
| 9,000,437 B2 * | 4/2015 | Hayashi | H01L 29/78669 | 257/57 |
| 9,035,385 B2 * | 5/2015 | Kanegae | H01L 29/78618 | 257/350 |
| 9,121,829 B2 * | 9/2015 | Kawashima | G01N 21/65 | |
| 9,178,075 B2 * | 11/2015 | Kawashima | H01L 29/66765 | |
| 9,209,308 B2 * | 12/2015 | Zhang | H01L 29/458 | |
| 9,716,119 B2 * | 7/2017 | Li | H01L 27/1288 | |
| 2008/0116457 A1 * | 5/2008 | Park | H01L 27/1214 | 257/59 |
| 2008/0318368 A1 * | 12/2008 | Ryu | H01L 29/7869 | 438/151 |
| 2009/0194770 A1 * | 8/2009 | Liu | H01L 27/1229 | 257/72 |
| 2010/0035379 A1 * | 2/2010 | Miyairi | H01L 27/1225 | 438/104 |
| 2010/0051940 A1 * | 3/2010 | Yamazaki | H01L 29/4908 | 257/43 |
| 2010/0051949 A1 * | 3/2010 | Yamazaki | H01L 29/4908 | 257/57 |
| 2010/0117074 A1 * | 5/2010 | Yamazaki | H01L 29/66742 | 257/43 |
| 2010/0134398 A1 * | 6/2010 | Toyota | G02F 1/1368 | 345/92 |
| 2010/0141872 A1 * | 6/2010 | Paek | G02F 1/133305 | 349/69 |
| 2010/0176383 A1 * | 7/2010 | Park | H01L 27/3262 | 257/40 |
| 2012/0300147 A1 * | 11/2012 | Shieh | H01L 29/7869 | 349/42 |
| 2013/0001559 A1 * | 1/2013 | Kishida | H01L 29/7866 | 257/57 |
| 2013/0002528 A1 * | 1/2013 | Ohhashi | G02F 1/134309 | 345/90 |
| 2013/0037806 A1 * | 2/2013 | Hayashi | H01L 29/78669 | 257/57 |
| 2013/0134429 A1 * | 5/2013 | Yamada | H01L 29/458 | 257/66 |
| 2013/0168678 A1 * | 7/2013 | Hayashi | H01L 29/66765 | 257/57 |
| 2013/0299837 A1 * | 11/2013 | Hayashi | H01L 29/66765 | 257/66 |
| 2013/0320339 A1 * | 12/2013 | Kawashima | H01L 29/66765 | 257/43 |
| 2014/0054590 A1 * | 2/2014 | Kanegae | H01L 29/66765 | 257/57 |
| 2014/0077213 A1 * | 3/2014 | Zhang | H01L 29/458 | 257/59 |
| 2014/0085560 A1 * | 3/2014 | Sung | G02F 1/13306 | 349/43 |
| 2014/0291483 A1 * | 10/2014 | Yamada | H04N 5/32 | 250/208.1 |
| 2015/0021594 A1 * | 1/2015 | Yamada | H01L 27/14616 | 257/43 |
| 2015/0021674 A1 * | 1/2015 | Yamada | H01L 27/14632 | 257/292 |
| 2015/0060990 A1 * | 3/2015 | Kim | H01L 29/7869 | 257/324 |
| 2015/0171113 A1 * | 6/2015 | Honjo | H01L 27/1222 | 257/72 |
| 2016/0087021 A1 * | 3/2016 | Sato | H01L 27/3262 | 257/43 |
| 2016/0155828 A1 * | 6/2016 | Sugawara | H01L 29/66969 | 438/104 |
| 2016/0163738 A1 * | 6/2016 | Sato | H01L 27/124 | 257/43 |
| 2016/0163762 A1 * | 6/2016 | Yamada | H01L 27/14632 | 257/72 |
| 2016/0260837 A1 * | 9/2016 | Koezuka | H01L 21/02565 | |
| 2016/0322395 A1 * | 11/2016 | Koezuka | H01L 27/1225 | |
| 2017/0025080 A1 * | 1/2017 | Aoki | G09G 3/3648 | |
| 2017/0133514 A1 * | 5/2017 | Yang | H01L 29/78648 | |
| 2017/0141140 A1 * | 5/2017 | Li | H01L 27/1288 | |
| 2017/0220185 A1 * | 8/2017 | Kurasawa | G06F 3/0412 | |
| 2017/0229584 A1 * | 8/2017 | Okada | H01L 29/78675 | |
| 2017/0236887 A1 * | 8/2017 | Hashimoto | H01L 27/3262 | 257/40 |
| 2017/0294456 A1 * | 10/2017 | Lee | H01L 27/1225 | |
| 2017/0294497 A1 * | 10/2017 | Lius | H01L 27/3262 | |

FOREIGN PATENT DOCUMENTS

| | | | | |
|---|---|---|---|---|
| JP | 2011-29373 | | 2/2011 | |
| JP | 2013128131 A | * | 6/2013 | ....... H01L 21/02565 |
| JP | 2013254963 A | * | 12/2013 | ....... H01L 21/02565 |
| JP | 2014045200 A | * | 3/2014 | ....... H01L 21/02565 |
| JP | 2015115469 A | * | 6/2015 | ......... H01L 27/1222 |
| KR | 100303711 B1 | * | 9/2001 | ........... H01L 21/336 |

OTHER PUBLICATIONS

Kwon et al., Recent progress in high performance and reliable n-type transition metal oxide-based thin film transistors, Semiconductor Science and Technology, 30, 2015, pp. 1-16.*

Kim et al., Performance improvement of polycrystalline thin-film transistor by adopting a very thin amorphous silicon buffer, Journal of Non-Crystalline Solids, 266-269, 2000, pp. 1265-1269.*

Tian et al., High-performance dual-layer channel indium gallium zinc oxide thin-film transistors fabricated in different oxygen contents at low temperature, Japanese Journal of Applied Physics, 53, 04EF07, 2014, pp. 1-4.*

Nozawa, Samsung, Hitachi Announce IGZO-based TFTs, Nikkei Technology Online, 2008, 2 pages.*

Chung et al., High mobility, dual layer, c-axis aligned crystalline/amorphous IGZO thin film transistor, Applied Physics Letters, 107, 183503, 2015, pp. 1-6.*

* cited by examiner

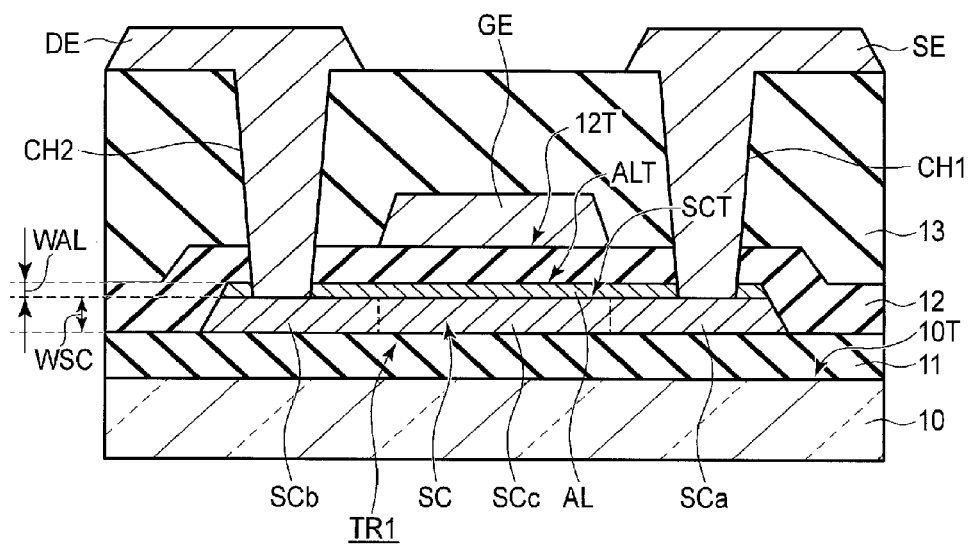
F I G. 1

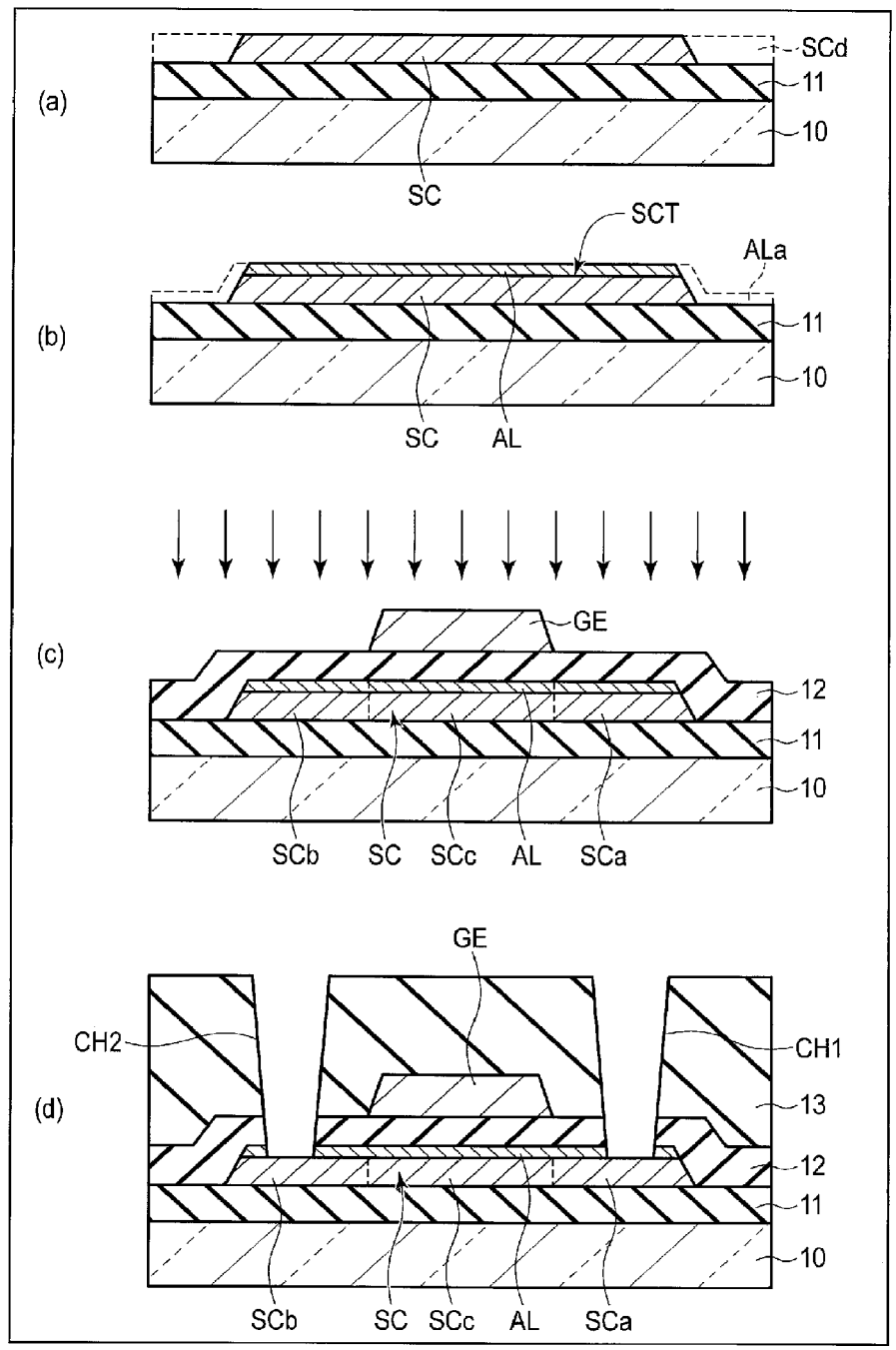
F I G. 2

THIN-FILM TRANSISTOR

CROSS-REFERENCE TO RELATED APPLICATIONS

This application is based upon and claims the benefit of priority from Japanese Patent Application No. 2016-022627, filed Feb. 9, 2016, the entire contents of which are incorporated herein by reference.

FIELD

Embodiments described herein relate generally to a thin-film transistor comprising a polycrystalline semiconductor layer.

BACKGROUND

For example, as a thin-film transistor applicable to display devices such as liquid crystal displays, various control circuits and the like, a type which uses polycrystalline silicon (polysilicon) for the semiconductor layer is developed.

Polycrystalline silicon contains a plurality of crystals different from each other in size and orientation surface. Polycrystalline silicon is obtained by, for example, the following technique in which a laser beam is irradiated onto amorphous silicon and then the fused silicon re-solidifies into poly-crystals. But, during this operation, crystals may collide with each other to create a projection in a crystal boundary (to be referred to as grain boundary hereinafter).

If such polycrystalline silicon is used for the semiconductor layer of a thin-film transistor, a gate insulating film is brought into contact with the projection created in the grain boundary of the polycrystalline silicon. Therefore, in the boundary between the semiconductor layer and the gate insulating film, an interface state is easily created. If an interface state is produced in the boundary between the semiconductor layer and the gate insulating film, the drain current flows at a voltage lower or equal to the threshold voltage, thereby creating the tendency of degrading the sub-threshold characteristics. Further, there are further tendencies of increasing the leakage current flowing into the semiconductor layer from the gate electrode, or decreasing the voltage resistance of the gate insulating film, which decreases the reliability of the thin-film transistor.

BRIEF DESCRIPTION OF THE DRAWINGS

FIG. 1 is a cross section schematically showing an example of a thin-film transistor according to the first embodiment.

FIG. 2 is a cross section showing an example of a method of manufacturing the thin-film transistor shown in FIG. 1.

DETAILED DESCRIPTION

Figure 3:
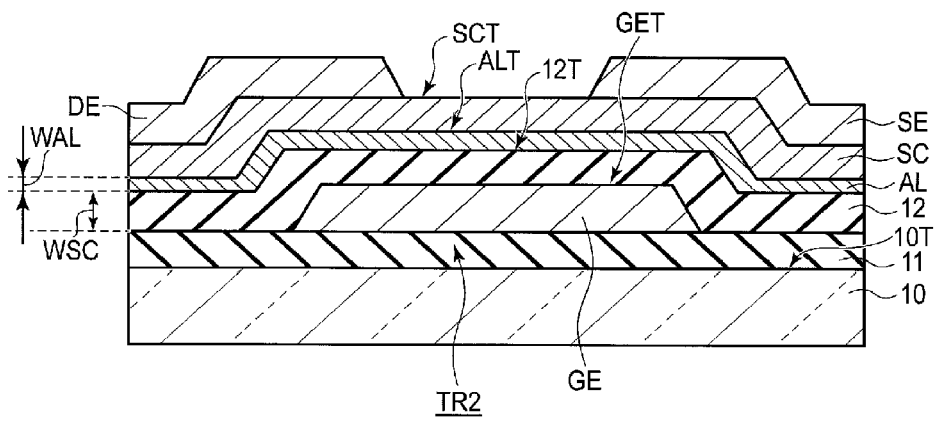
FIG. 3 is a cross section schematically showing an example of a thin-film transistor according to the second embodiment.

In general, according to one embodiment, there is provided a thin-film transistor comprising: a polycrystalline semiconductor layer; a gate electrode opposing the polycrystalline semiconductor layer; a gate insulating film provided between the gate electrode and the polycrystalline semiconductor layer and in contact with the gate electrode; and an amorphous layer provided between the gate insulating film and the polycrystalline semiconductor layer, and in contact with the gate insulating film and the polycrystalline semiconductor layer.

According to another embodiment, there is provided a thin-film transistor comprising: an insulating substrate; a polycrystalline semiconductor layer formed above a top surface of the insulating substrate; an amorphous layer in contact with a top surface of the polycrystalline semiconductor layer; an insulating film in contact with a top surface of the amorphous layer; a gate electrode in contact with a top surface of the insulating film; and first and second electrodes each in contact with the polycrystalline semiconductor.

According to yet another embodiment, there is provided a thin-film transistor comprising: an insulating substrate; a gate electrode formed above a top surface of the insulating substrate; an insulating film in contact with a top surface of the gate electrode; an amorphous layer in contact with a top surface of the insulating film; a polycrystalline semiconductor layer in contact with a top surface of the amorphous layer; and first and second electrodes each in contact with a top surface of the polycrystalline semiconductor layer.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

First Embodiment

FIG. 1 is a cross section schematically showing a thin-film transistor TR1 according to the first embodiment. The thin-film transistor TR1 is a top-gate thin-film transistor.

An insulating substrate 10 is formed from, for example, an insulating material such as glass or resin. The insulating substrate 10 includes a top surface 10T, on which a first insulating film 11 is formed as an underlayer.

On the first insulating film 11, an island-like semiconductor layer SC is formed. The semiconductor layer SC is formed from, for example, a polycrystalline semiconductor such as low-temperature polycrystalline silicon (LTPS).

The semiconductor layer SC comprises a source region SCa, a drain region SCb and a channel region SCc. The source region SCa and the drain region SCb are provided respectively on both ends of the semiconductor layer SC. To the source region SCa and the drain region SCb, impurities including, for example, phosphorus (P) are implanted to reduce the resistances of the regions. The channel region SCc is formed between the source region SCa and the drain region SCb. The channel region SCc has an impurity concentration lower than those of the source region SCa and the drain region SCb, and therefore has a high resistance.

On the semiconductor layer SC, an amorphous layer AL is formed. The amorphous layer AL is in contact with the top surface SCT of the semiconductor layer SC. In the example illustrated, the amorphous layer AL covers the entire top surface SCT. That is, the amorphous layer AL covers the source region SCa, the drain region SCb and the channel region SCc.

The amorphous layer AL is formed from, for example, a transparent amorphous oxide semiconductor (TAOS) containing an oxide of at least one of, for example, indium (In), gallium (Ga), zinc (Zn) and tin (Sn). The amorphous layer AL may be formed from, for example, some other amorphous material such as amorphous silicon, besides TAOS. When compared with the amorphous silicon, the oxide semiconductor is preferable because of its advantages, namely, high mobility, steep sub-threshold characteristics, low off-state current and the like.

The amorphous layer AL is thinner than the semiconductor layer SC and has such a degree of thickness that can flatten (planarize) the irregularities created by the grain boundary on the surface of the semiconductor layer SC. For example, a thickness WAL of the amorphous layer AL is, for example, approximately one tenth of a thickness WSC of the semiconductor layer SC. As an example, the thickness WSC of the semiconductor layer SC is 20 nm to 100 nm, whereas the thickness WAL of the amorphous layer AL is 2 nm to 10 nm.

The amorphous layer AL, the semiconductor layer SC and the first insulating film 11 are covered by a second insulating film 12 as a gate insulating film. In the example illustrated, the second insulating film 12 is in contact with the entire top surface ALT of the amorphous layer AL, the semiconductor layer SC and the first insulating film 11.

On the second insulating film 12, a gate electrode GE is formed. The gate electrode GE is in contact with a top surface 12T of the second insulating film 12. The gate electrode GE is formed at a location which opposes the channel region SCc of the semiconductor layer SC.

The gate electrode GE and the second insulating film 12 are covered by a third insulating film 13 as an interlayer insulating film. The first to third insulating films 11 to 13 are each formed of, for example an inorganic insulating material such as silicon oxide, silicon nitride or silicon oxynitride.

On the third insulating film 13, a source electrode SE and a drain electrode DE are formed. The source electrode SE and the drain electrode DE are connected to the source region SCa and the drain region SCb of semiconductor layer SC, respectively, via contact holes CH1 and CH2 made through the third insulating film 13, the second insulating film 12 and the amorphous layer AL. Further, the source electrode SE and the drain electrode DE are in contact with the amorphous layer AL within the contact holes CH1 and CH2.

Next, a method of manufacturing the thin-film transistor TR1 shown in FIG. 1 will be described with reference to FIG. 2, (a) to (d).

As shown in FIG. 2, (a), the first insulating film 11 of, for example, silicon oxide is formed on the insulating substrate 10 using, for example, a plasma chemical vapor deposition (CVD). Next, on the first insulating film 11, an amorphous silicon layer is formed using, for example, plasma CVD. Subsequently, pulsed light of an excimer laser, for example, is irradiated onto the amorphous silicon layer. Thus, silicon is fused then re-solidified to form the polycrystalline silicon layer SCd. Then, photolithography is carried out, and thereafter the polycrystalline silicon layer SCd is etched into the island-like semiconductor layer SC.

Next, as shown in FIG. 2, (b), the amorphous layer ALa of TAOS is formed so as to cover the semiconductor layer SC and the first insulating film 11 using, for example, a sputtering method. The amorphous layer ALa contains an oxide of at least one of, for example, indium (In), gallium (Ga), zinc (Zn) and tin (Sn). Subsequently, photolithography is carried out and thereafter, the amorphous layer ALa is etched to form the amorphous layer AL which covers only the top surface SCT of the semiconductor layer SC.

Next, as shown in FIG. 2, (c), the second insulating film 12 of, for example, silicon oxide is formed so as to cover the amorphous layer AL, the semiconductor layer SC and the first insulating film 11 using, for example, the plasma CVD. Subsequently, the gate electrode GE is formed on the second insulating film 12, so as to correspond to, for example, the central portion of the semiconductor layer SC. That is, a metal layer is formed from a metal material such as copper, aluminum, titanium, molybdenum or tungsten or an alloy containing at least one of these using, for example, the sputtering method. Then, photolithography is carried out and thereafter the metal layer is etched to form the gate electrode GE.

Next, n-type impurity ions of, for example, phosphorus (P), are implanted to the semiconductor layer SC with use of the gate electrode GE as a mask. Thus, the source region SCa and the drain region SCb, which have high impurity concentration and low resistance, are formed. Further, the channel region SCc having an impurity concentration lower than and a resistance higher than those of the source region SCa and the drain region SCb are formed between the source region SCa and the drain region SCb, that is, in the region opposing the gate electrode GE. In the amorphous layer AL as well, impurity ions are implanted to the region where the source region SCa and the drain region SCb overlap, and thus the impurity concentration of the region (where with the source region SCa and the drain region SCb overlap) becomes higher than that of the region which overlaps the channel region SCc.

Next, as shown in FIG. 2, (d), the third insulating film 13 of, for example, silicon oxide is formed all over the first insulating film 11 using, for example, the plasma CVD. Subsequently, the contact holes CH1 and CH2 are formed in through the third insulating film 13, the second insulating film 12 and the amorphous layer AL, so as to partially expose the source region SCa and the drain region SCb of semiconductor layer SC.

Next, on the third insulating film 13, a metal material such as copper, aluminum, titanium, molybdenum or tungsten, or an alloy containing at least one of these is formed to embedded the contact holes CH1 and CH2 with the metal material using, for example, the sputtering method. Subsequently, the metal material is patterned to form the source electrode SE and the drain electrode DE connected to contact plugs in the contact holes CH1 and CH2, and thus the thin-film transistor TR1 shown in FIG. 1 is formed.

Note that when the resistance of the amorphous layer AL exposed by the contact holes CH1 and CH2 is lower with use of, for example, silane gas, the contact holes CH1 and CH2 shown in FIG. 2, (d) or 1 need not be made through the amorphous layer AL. In this case, the contact plugs provided in the contact holes CH1 and CH2 are in contact with the amorphous layer AL made to have low resistance. The source electrode SE and the drain electrode DE are electrically connected to the semiconductor layer SC through the contact plugs provided in the contact holes CH1 and CH2, respectively, and the amorphous layer AL.

In this embodiment, the second insulating film 12 covers all over the first insulating film 11, but it suffices if the second insulating film 12 is formed directly under at least the gate electrode GE. In other words, the second insulating film 12 should only be formed at least in the region which overlaps the channel region SCc.

According to this embodiment, the amorphous layer AL is formed between the semiconductor layer SC and the second insulating film 12. The amorphous layer AL has a function of flattening (planarizing) irregularities created on the surface of the semiconductor layer SC by the grain boundary of the semiconductor layer SC between the semiconductor layer SC and the gate insulating film. In other words, since the amorphous layer AL covers projections created in the grain boundary of the semiconductor layer SC, the gate electrode GE is formed in the location opposing the flattened (planarized) portion of the amorphous layer AL. With this configuration, as compared to the case where the second insulating film 12 is formed in contact with the projections created in the grain boundary of the semiconductor layer SC, the interface state produced in the boundary between the semiconductor layer SC and the second insulating film 12 can be suppressed. As a result, the sub-threshold characteristics of the thin-film transistor TR1 can be improved, and the increase in leakage current flowing to the semiconductor layer from the gate electrode can be suppressed. Furthermore, the voltage resistance of the gate insulating film can be improved, thereby making it possible to improve the electrical characteristics of the thin-film transistor TR1.

Moreover, the thickness WAL of the amorphous layer AL is such a thickness that can cover the irregularities created on the surface of the semiconductor layer SC by the grain boundary of semiconductor layer SC, but sufficiently less than that of the semiconductor layer SC. With this configuration, the most of the current passing through the thin-film transistor TR1 flows through the semiconductor layer SC. That is, the electrical characteristics of the thin-film transistor TR1 is determined mainly by the semiconductor layer SC. Therefore, the thin-film transistor TR1 of this embodiment can decrease the generation of the interface state, which is a problem specific to the thin-film transistors using polycrystalline silicon, while maintaining the high carrier mobility, which is also a feature of the thin-film transistors using polycrystalline silicon.

Second Embodiment

FIG. 3 is a cross section schematically showing a thin-film transistor TR2 according to the second embodiment. The second embodiment is different from the first embodiment in that the thin-film transistor TR2 is a bottom-gate type. Hereafter, the main differences will be described.

A gate electrode GE is formed on a top surface 10T side of the substrate 10. In the example illustrated, it is formed on the first insulating film 11. The gate electrode GE and the first insulating film 11 are covered by a second insulating film 12. That is, the second insulating film 12 is in contact with the top surface GET of the gate electrode GE and the first insulating film 11.

On the second insulating film 12, an amorphous layer AL, for example, of TAOS is formed. In the example illustrated, the amorphous layer AL is in contact with an entire top surface 12T of the second insulating film 12. On the amorphous layer AL, a semiconductor layer SC formed from, for example, a low-temperature polycrystalline silicon, is formed. In the example illustrated, the semiconductor layer SC is in contact with an entire top surface ALT of the amorphous layer AL. Since the amorphous layer AL is interposed between the semiconductor layer SC and the second insulating film 12, the semiconductor layer SC is separated from the second insulating film 12.

On the semiconductor layer SC, a source electrode SE and a drain electrode DE are formed. The source electrode SE and the drain electrode DE are in contact with a top surface SCT of the semiconductor layer SC. The source electrode SE partially overlaps an end region of the gate electrode GE and the drain electrode DE partially overlaps the other end region of the gate electrode GE.

The relationship between a thickness WAL of the amorphous layer AL and a thickness WSC of semiconductor layer SC is similar to that of the first embodiment.

According to this embodiment, the amorphous layer AL is formed on the entire surface of the second insulating film 12 and the semiconductor layer SC is formed on the amorphous layer AL. That is, even with a bottom-gate thin-film transistor, it is possible to obtain an advantageous effect similar to that of the first embodiment by forming the amorphous layer AL between the semiconductor layer SC and the second insulating film 12.

Third Embodiment

Figure 4:
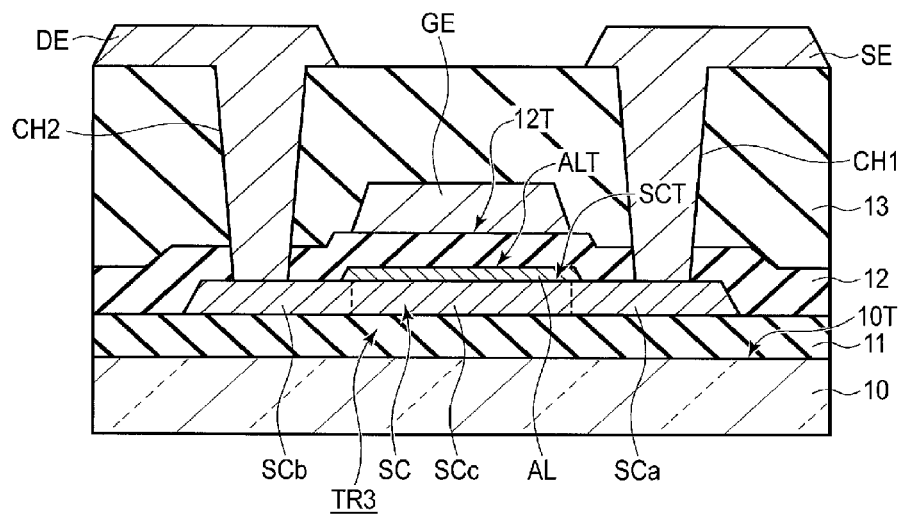
FIG. 4 is a cross section schematically showing an example of a thin-film transistor according to the third embodiment.

FIG. 4 is a cross section schematically showing a thin-film transistor TR3 according to the third embodiment. The third embodiment is different from the first embodiment in that the amorphous layer AL selectively covers the channel region SCc to expose the source region SCa and the drain region SCb. That is, the amorphous layer AL is formed in a region between semiconductor layer SC and the second insulating film 12, which opposes at least the gate electrode GE. The second insulating film 12 is in contact with the top surface AL of the amorphous layer AL and also with the top surface SCT of semiconductor layer SC. The source electrode SE and the drain electrode DE are separated from the amorphous layer AL.

According to this embodiment, the amorphous layer AL is formed between the channel region SCc and the second insulating film 12 of the thin-film transistor TR3, and therefore an advantageous effect similar to that of the first embodiment can be obtained.

Fourth Embodiment

Figure 5:
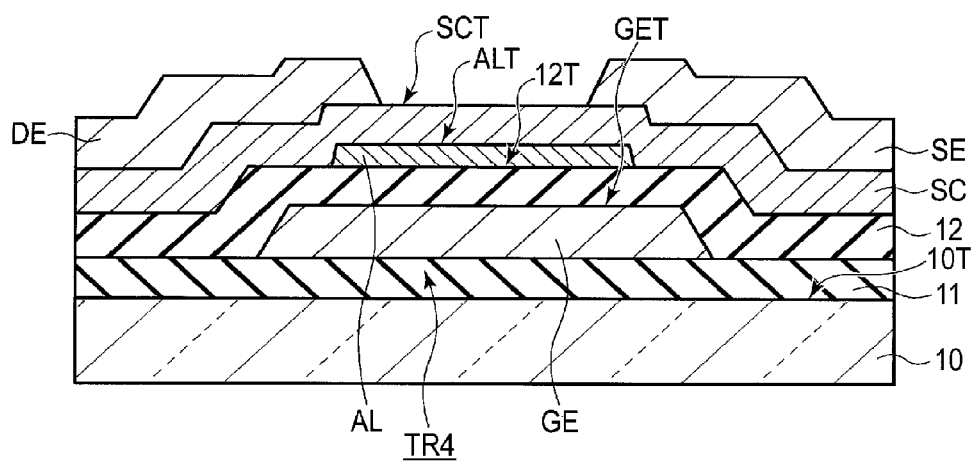
FIG. 5 is a cross section schematically showing an example of a thin-film transistor according to the fourth embodiment.

FIG. 5 is a cross section schematically showing a thin-film transistor TR4 according to the fourth embodiment.

The fourth embodiment is different from the second embodiment in that the amorphous layer is provided selectively between the source electrode SE and the drain electrode DE. In the example illustrated, both ends of the amorphous layer AL overlap the source electrode SE and the drain electrode DE, respectively. The semiconductor layer SC is in contact with the top surface ALT of the amorphous layer AL and also with the top surface 12T of the second insulating film 12.

In this embodiment as well, the amorphous layer AL is formed in a region equivalent to the channel region, that is, a region opposing the gate electrode GE and between the source electrode SE and the drain electrode DE, and therefore an advantageous effect similar to that of the first embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thin-film transistor comprising:
a polycrystalline semiconductor layer;
a gate electrode opposing the polycrystalline semiconductor layer;
a gate insulating film provided between the gate electrode and the polycrystalline semiconductor layer and in contact with the gate electrode; and
an amorphous layer provided between the gate insulating film and the polycrystalline semiconductor layer, and in contact with the gate insulating film and the polycrystalline semiconductor layer, wherein
the polycrystalline semiconductor layer comprises a source region, a drain region and a channel region provided between the source region and the drain region, and
the amorphous layer covers the channel region and exposes the source region and the drain region.

2. The thin-film transistor of claim 1, further comprising first and second electrodes in contact with the polycrystalline semiconductor layer,
wherein
the first and second electrodes are separated from the amorphous layer.

3. The thin-film transistor of claim 1, wherein
the amorphous layer is thinner than the polycrystalline semiconductor layer.

4. The thin-film transistor of claim 1, wherein
the amorphous layer is an oxide semiconductor layer containing an oxide of at least one of indium, gallium, zinc and tin.

5. The thin-film transistor of claim 1, wherein
the polycrystalline semiconductor layer is of polycrystalline silicon.

6. A thin-film transistor comprising:
an insulating substrate;
a polycrystalline semiconductor layer formed above a top surface of the insulating substrate;
an amorphous layer in contact with a top surface of the polycrystalline semiconductor layer;
an insulating film in contact with a top surface of the amorphous layer;
a gate electrode in contact with a top surface of the insulating film; and
first and second electrodes each in contact with the polycrystalline semiconductor, wherein
the insulating film is in contact with the top surface of the polycrystalline semiconductor layer, and
the first electrode and the second electrode are separated from the amorphous layer.

7. The thin-film transistor of claim 6, wherein
the amorphous layer is thinner than the polycrystalline semiconductor layer.

8. The thin-film transistor of claim 6, wherein
the amorphous layer is an oxide semiconductor layer containing an oxide of at least one of indium, gallium, zinc and tin.

9. The thin-film transistor of claim 6, wherein
the polycrystalline semiconductor layer is of polycrystalline silicon.

10. A thin-film transistor comprising:
an insulating substrate;
a gate electrode formed above a top surface of the insulating substrate;
an insulating film in contact with a top surface of the gate electrode;
an amorphous layer in contact with a top surface of the insulating film;
a polycrystalline semiconductor layer in contact with a top surface of the amorphous layer; and
first and second electrodes each in contact with a top surface of the polycrystalline semiconductor layer, wherein
the polycrystalline semiconductor layer is in contact with the top surface of the insulating film.

11. The thin-film transistor of claim 10, wherein
the amorphous layer is thinner than the polycrystalline semiconductor layer.

12. The thin-film transistor of claim 10, wherein
the amorphous layer is an oxide semiconductor layer containing an oxide of at least one of indium, gallium, zinc and tin.

13. The thin-film transistor of claim 10, wherein
the polycrystalline semiconductor layer is of polycrystalline silicon.

* * * * *